United States Patent
Chien et al.

(10) Patent No.: US 7,891,502 B2
(45) Date of Patent: Feb. 22, 2011

(54) CIRCUIT BOARD CARRIER

(75) Inventors: Wei-Lieh Chien, Lu Chu Hsiang (TW); Lai-Wang Yu, Lu Chu Hsiang (TW)

(73) Assignee: Compeq Manufacturing Company Limited, Shin Chuang Village, Lu Chu Hsiang, Taoyuan Hsien (TW)

( * ) Notice: Subject to any disclaimer, the term of this patent is extended or adjusted under 35 U.S.C. 154(b) by 156 days.

(21) Appl. No.: 12/313,290

(22) Filed: Nov. 18, 2008

(65) Prior Publication Data

US 2010/0122959 A1    May 20, 2010

(51) Int. Cl.
*H05K 7/14* (2006.01)
(52) U.S. Cl. .................. 211/41.17; 248/201; 361/802
(58) Field of Classification Search ............... 211/41.17; 248/201; 361/802, 807, 810, 756, 759, 760; 269/48.1–48.3, 54.4, 54.5, 903; 174/138 G; 29/739–741, 825, 832, 833, 840; 206/706
See application file for complete search history.

(56) References Cited

U.S. PATENT DOCUMENTS

| | | | |
|---|---|---|---|
| 1,168,147 A * | 1/1916 | Bender | 249/48 |
| 2,338,296 A * | 1/1944 | Meyer | 269/54.5 |
| 3,392,972 A * | 7/1968 | Wing | 269/87.2 |
| 4,030,717 A * | 6/1977 | Serlovsky | 269/118 |
| 4,291,867 A * | 9/1981 | Williams et al. | 269/43 |
| 4,948,108 A * | 8/1990 | Sullivan | 269/43 |
| 5,067,648 A * | 11/1991 | Cascini | 228/47.1 |
| 6,166,916 A * | 12/2000 | Jelinger | 361/756 |
| 6,209,859 B1 * | 4/2001 | Chung | 269/111 |
| 6,450,491 B1 * | 9/2002 | McEvoy | 269/118 |
| 6,981,301 B2 * | 1/2006 | Medina et al. | 29/281.5 |
| 7,209,359 B2 * | 4/2007 | Matthews | 361/752 |

* cited by examiner

*Primary Examiner*—Korie Chan
(74) *Attorney, Agent, or Firm*—Charles E. Baxley

(57) ABSTRACT

A circuit board carrier has main frame, at least one first holder, at least one slide and at least one second holder. The first and second holders are mounted on and selectively slide on the main frame. The slide is mounted on and selectively slides on the corresponding first holder. The slide has a first pin and the second holder has a second pin. The circuit board is held on the circuit board carrier by the pins. Therefore, the circuit board is kept from being contacted to the delivering wheels during manufacturing and is not polluted and trapped by the delivering wheels.

12 Claims, 4 Drawing Sheets

CIRCUIT BOARD CARRIER

BACKGROUND OF THE INVENTION

1. Field of the Invention

The present invention relates to a carrier, especially to a carrier that is used to hold a circuit board while manufacture.

2. Description of the Prior Arts

Circuit boards have many electronic elements being mounted thereon. The circuit boards have multiple holes and circuits to mount and electrically connect the electronic elements. To form the holes and the circuits, the circuit boards need to proceed with drilling, etching, and the like by automatic equipment.

In the automatic equipment, many wheels are used to deliver the circuit boards to each process. Because each process has its own treatment, each process uses different chemical reagents such as etching liquids, developing liquids and the like. The reagent of a former process remained on one circuit board is brought to a later process and pollutes the wheels in the equipment for the later process to further effect the other circuit boards. Therefore, the yield of the circuit boards is reduced.

Further, when manufacturing the flexible circuit boards, the flexible circuit boards are easily trapped between the wheels and are hard to maintain flat between the wheels. Therefore, using wheels to deliver the flexible circuit board is not convenient.

To overcome the shortcomings, the present invention provides a to mitigate or obviate the aforementioned problems.

SUMMARY OF THE INVENTION

The main objective of the present invention is to provide a circuit board carrier to keep the circuit board from contacting to the delivering wheels during manufacturing. The circuit board carrier has main frame, at least one first holder, at least one slide and at least one second holder. The first and second holders are mounted on and selectively slide on the main frame. The slide is mounted on and selectively slides on the corresponding first holder. The slide has a first pin and the second holder has a second pin. The circuit board is held on the circuit board carrier by the pins. Therefore, the circuit board is kept from being contacted to the delivering wheels during manufacturing and is not polluted and trapped by the delivering wheels.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
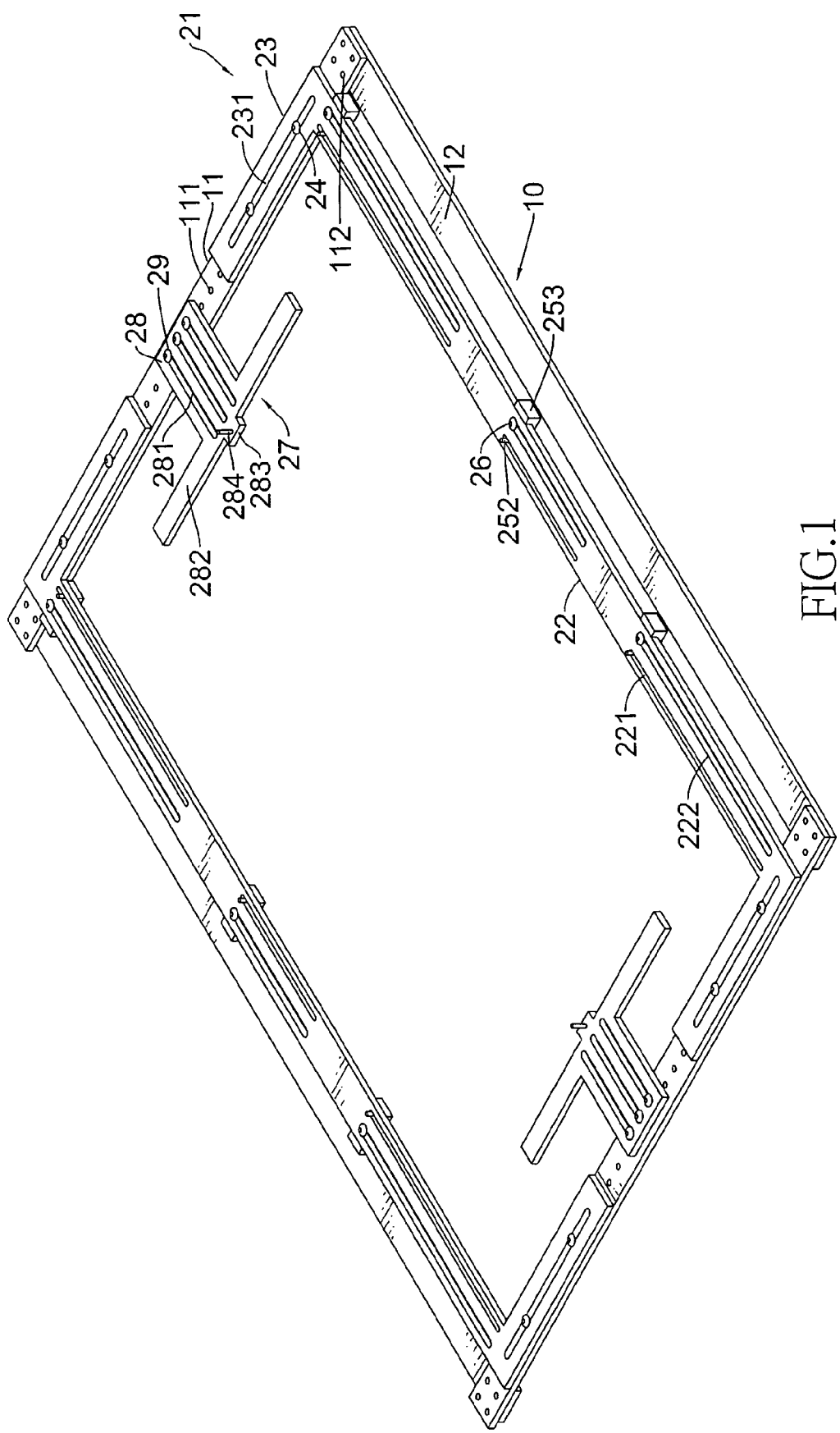
FIG. 1 is a perspective view of a circuit board carrier in accordance with the present invention.
Figure 2:
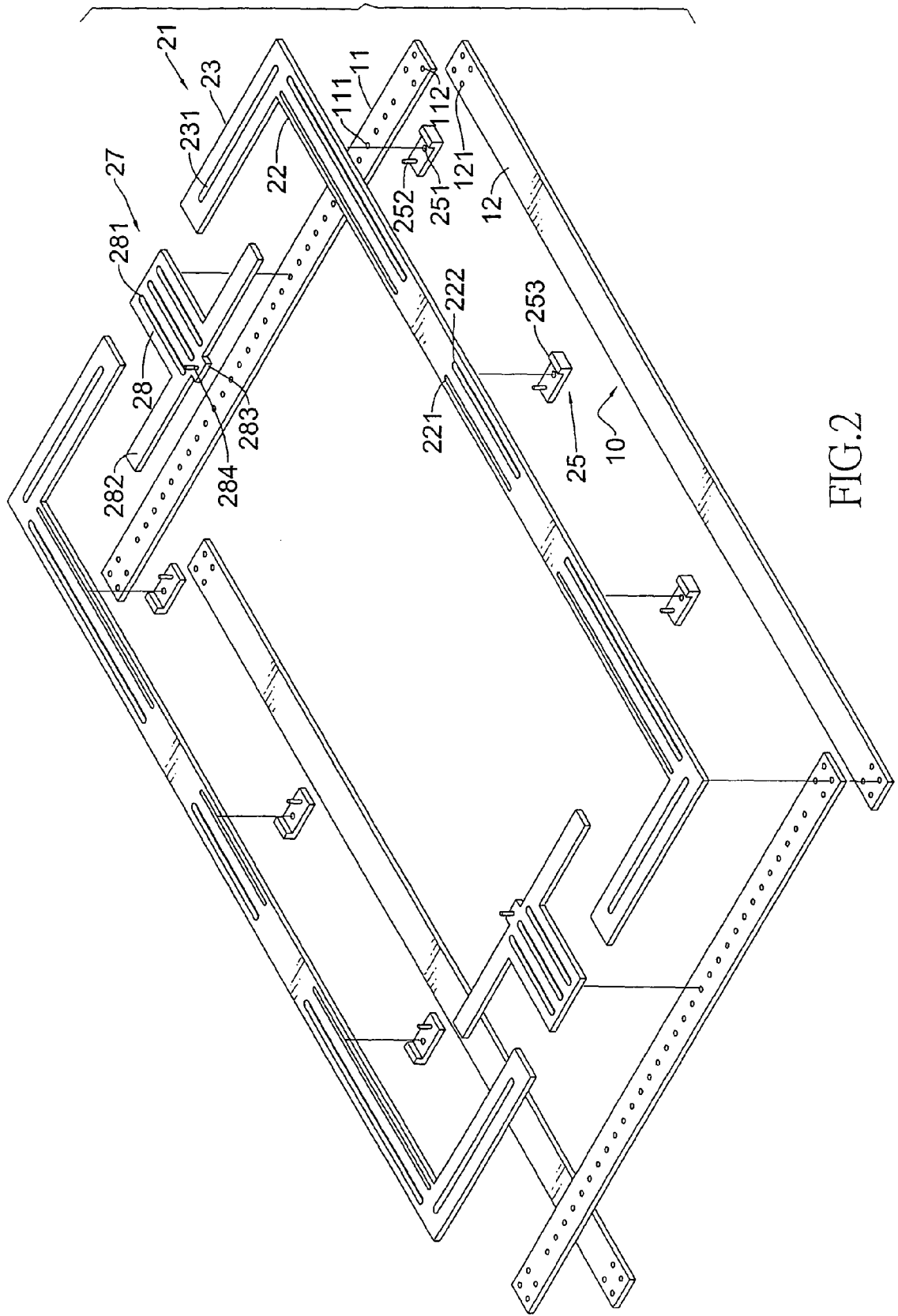
FIG. 2 is a partially exploded perspective view of the circuit board carrier in FIG. 1.

With reference to FIGS. 1 and 2, a circuit board carrier in accordance with the present invention is rigid and comprises a main frame (10), at least one first holder (21), at least one slide (25) and at least one second holder (22).

The main frame (10) comprises two transverse brackets (11) and two longitudinal brackets (12).

Each transverse bracket (11) has two ends, a top surface, a bottom surface, multiple threaded holes (111) and multiple fastening holes (112). The threaded holes (111) are formed through the transverse bracket (11) and are spaced in intervals. The fastening holes (112) are formed through the transverse bracket (11) respectively near the ends of the transverse bracket (11).

The longitudinal brackets (12) are mounted securely between the transverse brackets (11). Each longitudinal bracket (12) is securely attached respectively to the bottom surfaces of the transverse brackets (11) and has two ends and multiple fastening holes (121). The ends of the longitudinal bracket (12) are attached respectively to the corresponding ends of the transverse brackets (11). The fastening holes (121) are formed through the longitudinal bracket (12) and respectively aligns with the corresponding fastening holes (112) of the transverse bracket (11). Multiple fasteners are mounted through the fastening holes (112, 121) to securely attach the longitudinal brackets (12) to the transverse brackets (11).

The at least one first holder (21) is mounted on and selectively slides on the main frame (10) and may be mounted on and selectively slide on the top surface of the transverse brackets (11). In the preferred embodiment, the circuit board carrier of the present invention has two first holders (21). Each first holder (21) has a longitudinal arm (22) and two transverse arms (23).

The longitudinal arm (22) is mounted between the transverse brackets (11) and has two ends, at least one first longitudinal channels (221) and at least one second longitudinal channels (222). The longitudinal channels (221, 222) are formed through the longitudinal arm (22). Each second longitudinal channel (222) is parallel with one first longitudinal channel (221).

In the preferred embodiment, the longitudinal arm (22) has three first longitudinal channels (221) and three second longitudinal channels (222). The first longitudinal channels (221) align with each other and the second longitudinal channels (222) align with each other.

The transverse arms (23) are formed respectively on the ends of the longitudinal arm (22) and is mounted respectively on and selectively slides on transverse brackets (11). Each transverse arm (23) has a transverse channel (231) and at least one first screw (24). The transverse channel (231) is formed through the transverse arm (23) and corresponds to the threaded holes (111) of the transverse bracket (11). Each first screw (24) is mounted through the transverse channel (231) and a corresponding threaded hole (111) of the transverse bracket (11) and is selectively fastened in the corresponding threaded hole (111) to selectively hold the first holder (21) in position.

The at least one slide (25) is mounted on and selectively slides on the corresponding first holder (21) and may be mounted on and selectively slide on the longitudinal arm (22) of the corresponding first holder (21). Each slide (25) has an abutting surface, a threaded hole (251), a second screw (26), a first pin (252) and a lip (253). The threaded hole (251) is formed through the slide (25) and corresponds to one second longitudinal channel (222) of the longitudinal arm (22). The second screw (26) is mounted through the corresponding second longitudinal channel (222) of the longitudinal arm (22) and the threaded hole (251) of the slide (25) and is selectively fastened in the threaded hole (251) of the slide (25) to hold the slide (25) in position. The first pin (252) is formed on the abutting surface of the slide (25) and protrudes through the corresponding first longitudinal channel (221) of the longitudinal arm (22). The lip (253) is formed on the abutting surface of the slide (25) and abuts a side of the corresponding longitudinal arm (22).

In the preferred embodiment, the circuit board carrier of the present invention has six slides (25). Each slide (25) corresponds to one first longitudinal channel (221) and one second longitudinal channel (222) that are parallel to each other.

The at least one second holder (27) is mounted on and selectively slides on the main frame (10) and may be mounted on and selectively slide on the top surface of the corresponding transverse bracket (11). In the preferred embodiment, the circuit board carrier of the present invention has two second holders (22). Each second holder (22) has a body, a second pin (284) and multiple third screws (29).

The body is mounted on and selectively slides on the top surface of the main frame (10) and has a guiding bracket (28), a holding arm (282) and a protrusion (283). The guiding bracket (28) is mounted on and selectively slides on the top surface of the corresponding transverse bracket (11) and has an end and multiple sliding slots (281). The sliding slots (281) are formed through the guiding bracket (28) and respectively correspond to the threaded holes (111) of the corresponding transverse bracket (11). The holding arm (282) is formed perpendicularly on the ends of the guiding bracket (28) and has a distal edge. The protrusion (283) protrudes from the distal edge of the holding arm (282) and has an abutting surface.

The second pin (284) protrudes from the body and may be formed on the abutting surface of the protrusion (283).

The third screws (29) are mounted respectively through the sliding slots (281) and the corresponding threaded holes (111) of the corresponding transverse bracket (11) and are selectively fastened in the corresponding threaded holes (111) to hold the second holder (27) in position.

Figure 3:
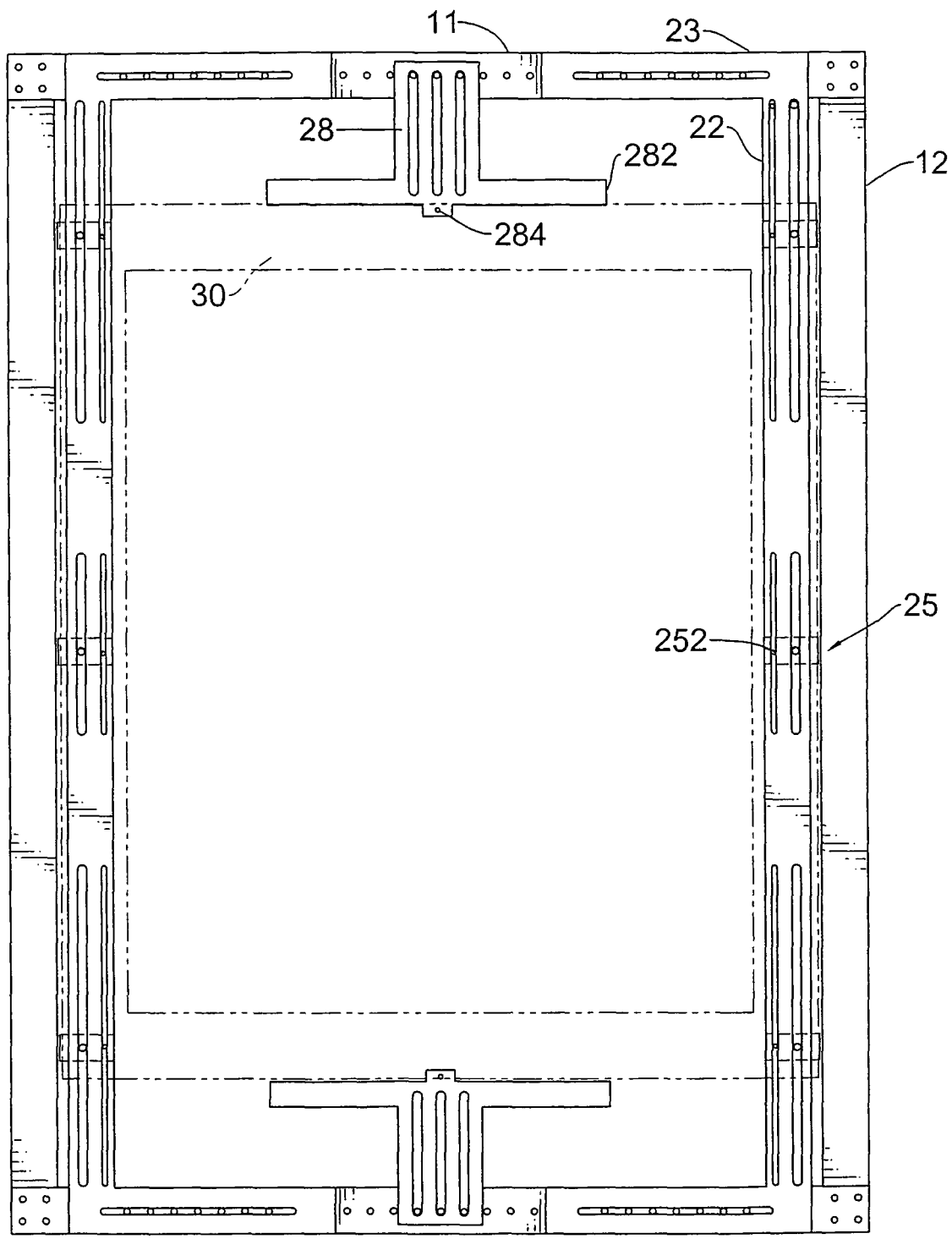
FIG. 3 is an operational top view of the circuit board carrier in FIG. 1 with the circuit board.
Figure 4:
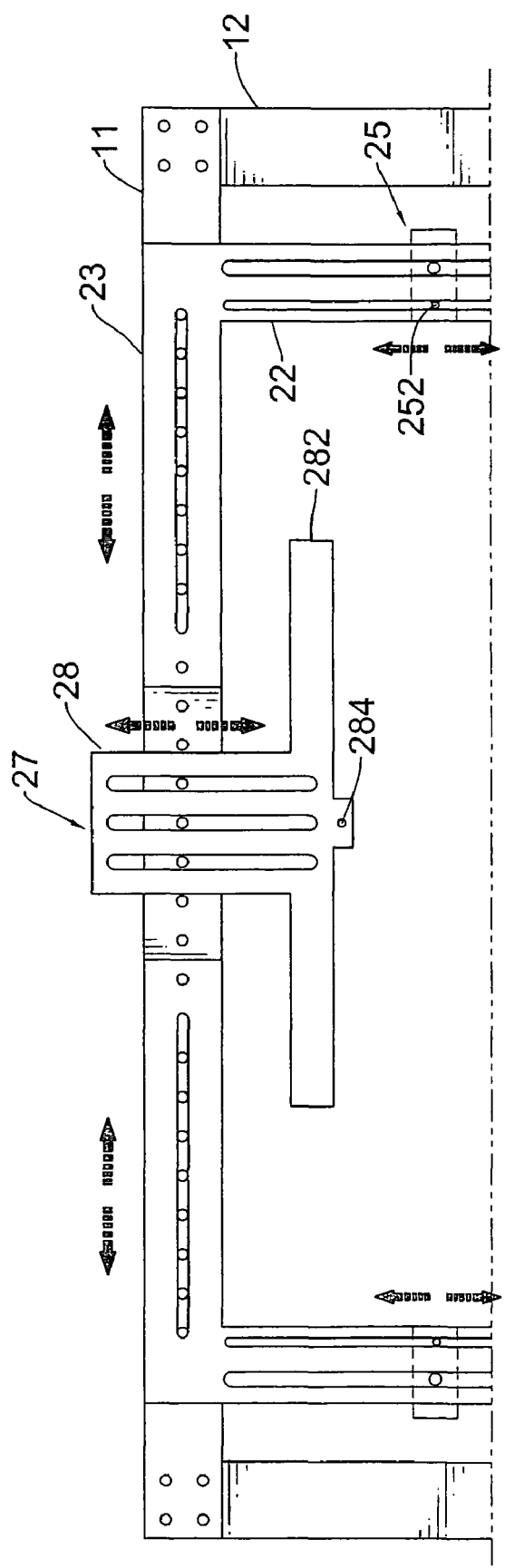
FIG. 4 is an operational enlarged partially top view of the circuit board carrier in FIG. 1.

With further reference to FIGS. 3 and 4, the circuit board carrier as described holds a circuit board (30). The first and second holders (21, 27) and the slides (25) slide relative to the main frame (10) to adjust the their position. The first and second pins (252, 284) are moved to align with and protrude through the certain holes in the circuit board (30) to hold the circuit board on the circuit board carrier as described.

The circuit board carrier as described has following advantages. The circuit board carrier as described holds the circuit board to keep the circuit board from contacting with the delivering wheels during manufacturing. Therefore, the circuit board is not polluted and is not trapped by the delivering wheels. Furthermore, the positions of the first and second holders (21, 27) and the slides (25) are adjustable. Therefore, the circuit board carrier as described is suitable for the circuit boards with different sizes.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A circuit board carrier comprising:
a main frame;
at least one first holder being mounted on and selectively sliding on the main frame;
at least one slide mounted on and selectively slides on a corresponding first holder, and each one of the at least one slide having
an abutting surface; and
a first pin being formed on the abutting surface of the slide; and
at least one second holder being mounted on and selectively sliding on the main frame, and each one of the at least one second holder having
a body being mounted on and selectively sliding on the top surface of the main frame; and
a second pin protruding from the body wherein the main frame has two transverse brackets, and each transverse bracket having
two ends;
a top surface;
a bottom surface; and
multiple threaded holes being formed through the transverse bracket and being spaced in intervals; and
two longitudinal brackets being mounted securely between the transverse brackets, and each longitudinal bracket being securely attached respectively to the bottom surfaces of the transverse brackets and having two ends being attached respectively to corresponding ends of the transverse brackets;
the at least one first holder is mounted on and selectively slides on the top surfaces of the transverse brackets, and each one of the at least one first holder has
a longitudinal arm being mounted between the transverse brackets and having
two ends;
at least one first longitudinal channels being formed through the longitudinal arm; and
at least one second longitudinal channels being formed through the longitudinal arm, and each one of the at least one second longitudinal channels being parallel with one first longitudinal channel; and
two transverse arms being formed respectively on the ends of the longitudinal arm and being mounted respectively on and selectively sliding on transverse brackets, and each transverse arm having
a transverse channel being formed through the transverse arm and corresponding to the threaded holes of the corresponding transverse bracket; and
at least one first screw, and each one of the at least one first screw being mounted through the transverse channel and a corresponding threaded hole of the transverse bracket and being selectively fastened in the corresponding threaded hole;
the at least one slide is mounted on and selectively slides on the longitudinal arm of the corresponding first holder, and each one of the at least one slide has
a threaded hole being formed through the slide and corresponding to one second longitudinal channel of the longitudinal arm of the corresponding first holder; and
a second screw being mounted through the corresponding second longitudinal channel of the longitudinal arm and the threaded hole of the slide and being selectively fastened in the threaded hole of the slide;
the body of each one of the at least one second holder has
a guiding bracket being mounted on and selectively sliding on the top surface of the corresponding transverse bracket and having
an end; and multiple sliding slots being formed through the guiding bracket and respectively corresponding to the threaded holes of the corresponding transverse bracket; and the at least one second holder is mounted on and selectively slides on the top surface of the corresponding transverse bracket, and each one of the at least one second holder has multiple third screws being mounted respectively through the sliding slots and the corresponding threaded holes of the corresponding transverse bracket and being selectively fastened in the corresponding threaded holes.

2. The circuit board carrier as claimed in claim 1 wherein the circuit board carrier has two first holders and two second holders.

3. The circuit board carrier as claimed in claim 2, wherein the longitudinal arm has three first longitudinal channels and three second longitudinal channels, and the first longitudinal channels align with each other and the second longitudinal channels align with each other; and the circuit board carrier has six slides, and each slide corresponds to one first longitudinal channel and one second longitudinal channel that are parallel to each other.

4. The circuit board carrier as claimed in claim 3, wherein each slide has a lip being formed on the abutting surface of the slide and abutting a slide of the corresponding longitudinal arm.

5. The circuit board as claimed in claim 4, wherein each transverse arm of each first holder has two first screws.

6. The circuit board carrier as claimed in claim 1 wherein the longitudinal arm has three first longitudinal channels and there second longitudinal channels, and the first longitudinal channels align with each other and the second longitudinal channels align with each other; and the circuit board carrier has six slides, and each slide corresponds to one first longitudinal channels and one second longitudinal channel that are parallel to each other.

7. The circuit board carrier as claimed in claim 1 wherein each one of the at least one slide has a lip being formed on the abutting surface of the slide and abutting a side of the corresponding longitudinal arm.

8. The circuit board as claimed in claim 1 wherein each transverse arm of each one of the at least one first holder has two first screws.

9. The circuit board carrier as claimed in claim 8, wherein the body of each second holder further has a holding arm being formed perpendicularly on the ends of the guiding bracket and having a distal edge; and a protrusion being from the distal edge of the holding arm and having an abutting surface; and the second pin of each second holder is formed on the abutting surface of the protrusion.

10. The circuit board carrier as claimed in claim 9 is rigid.

11. The circuit board carrier as claimed in claim 1 wherein the body of each one of the at least one second holder further has a holding arm being formed perpendicularly on the ends of the guiding bracket and having a distal edge; and a protrusion being from the distal edge of the holding arm and having an abutting surface; and the second pin of each one of the at least one second holder is formed on the abutting surface of the protrusion.

12. The circuit board carrier as claimed in claim 1 is rigid.

* * * * *